(12) United States Patent
Jha

(10) Patent No.: US 10,153,726 B2
(45) Date of Patent: Dec. 11, 2018

(54) NON-CONCENTRATED PHOTOVOLTAIC AND CONCENTRATED SOLAR THERMAL HYBRID DEVICES AND METHODS FOR SOLAR ENERGY COLLECTION

(71) Applicant: Binay Jha, Stillwater, OK (US)

(72) Inventor: Binay Jha, Stillwater, OK (US)

( * ) Notice: Subject to any disclaimer, the term of this patent is extended or adjusted under 35 U.S.C. 154(b) by 162 days.

(21) Appl. No.: 15/269,522

(22) Filed: Sep. 19, 2016

(65) Prior Publication Data

US 2018/0083572 A1 Mar. 22, 2018

(51) Int. Cl.
| | |
|---|---|
| *H02N 6/00* | (2006.01) |
| *H01L 31/042* | (2014.01) |
| *H02S 40/44* | (2014.01) |
| *H02S 40/22* | (2014.01) |
| *H01L 31/054* | (2014.01) |
| *F24S 23/70* | (2018.01) |
| *F24S 10/70* | (2018.01) |
| *H01L 31/0224* | (2006.01) |

(52) U.S. Cl.
CPC ............. *H02S 40/44* (2014.12); *F24S 10/70* (2018.05); *F24S 23/70* (2018.05); *H01L 31/022425* (2013.01); *H01L 31/054* (2014.12); *H01L 31/0547* (2014.12); *H02S 40/22* (2014.12)

(58) Field of Classification Search
CPC ....... H02S 40/44; H02S 40/22; H01L 31/054; H01L 31/022425; H01L 31/0547; F24S 23/70; F24S 10/70
See application file for complete search history.

(56) References Cited

U.S. PATENT DOCUMENTS

| | | | |
|---|---|---|---|
| 3,888,698 A | 6/1975 | Lindmayer et al. |
| 4,700,013 A | 10/1987 | Soule |
| 6,057,504 A | 5/2000 | Izumi |
| 6,415,783 B1 | 7/2002 | Harrison |
| 6,603,069 B1 | 8/2003 | Muhs et al. |
| 8,410,351 B1 | 4/2013 | Gu |
| 8,455,755 B2 | 6/2013 | Correia et al. |
| 2004/0011395 A1 | 1/2004 | Nicoletti et al. |
| 2008/0223436 A1 | 9/2008 | Den Boer et al. |

(Continued)

FOREIGN PATENT DOCUMENTS

| | | |
|---|---|---|
| DE | 19725023 A1 | 12/1998 |
| EP | 1126529 A2 | 8/2001 |

(Continued)

*Primary Examiner* — Angelo Trivisonno
(74) *Attorney, Agent, or Firm* — Patterson Thuente Pedersen, P.A.

(57) ABSTRACT

In embodiments, the inefficiencies present in conventional technologies that separately utilize photovoltaic or solar thermal technologies are obviated. Embodiments relate generally to a solar energy collection device having a focusing element with a shape configured to direct collimated incident light to a common focal region. A focus tube is then arranged at the focal region. The focus tube has an internal bore containing a working fluid and also configured to absorb incident and focused light that is and transferred to the working fluid. The focus tube is mechanically coupled to the focusing element with a mounting structure serving to maintain focus tube's position at the focal region. A photovoltaic cell array is then arranged on the focusing element. The photovoltaic cell array comprises a plurality of individual photovoltaic cells, each having a bandgap potential.

16 Claims, 11 Drawing Sheets

(56) References Cited

U.S. PATENT DOCUMENTS

| | | |
|---|---|---|
| 2008/0314436 A1 | 12/2008 | O'Connell et al. |
| 2010/0116322 A1 | 5/2010 | Helbig et al. |
| 2010/0154866 A1 | 6/2010 | Khan |
| 2010/0282315 A1 | 11/2010 | Gilbert |
| 2011/0186106 A1 | 8/2011 | Parker et al. |
| 2012/0037206 A1 | 2/2012 | Norman et al. |
| 2012/0180854 A1 | 7/2012 | Bellanger et al. |
| 2012/0192922 A1 | 8/2012 | Waring |
| 2012/0273026 A1 | 11/2012 | Chatterjee et al. |
| 2014/0366930 A1 | 12/2014 | Desaut et al. |
| 2016/0049903 A1 | 2/2016 | Ahlgren et al. |

FOREIGN PATENT DOCUMENTS

| | | |
|---|---|---|
| GB | 2473328 A | 3/2011 |
| NL | 1006838 C2 | 3/1999 |
| WO | WO2007056985 A2 | 5/2007 |
| WO | WO2012076847 A1 | 6/2012 |
| WO | WO2012151215 A2 | 11/2012 |
| WO | WO2013098489 A1 | 7/2013 |

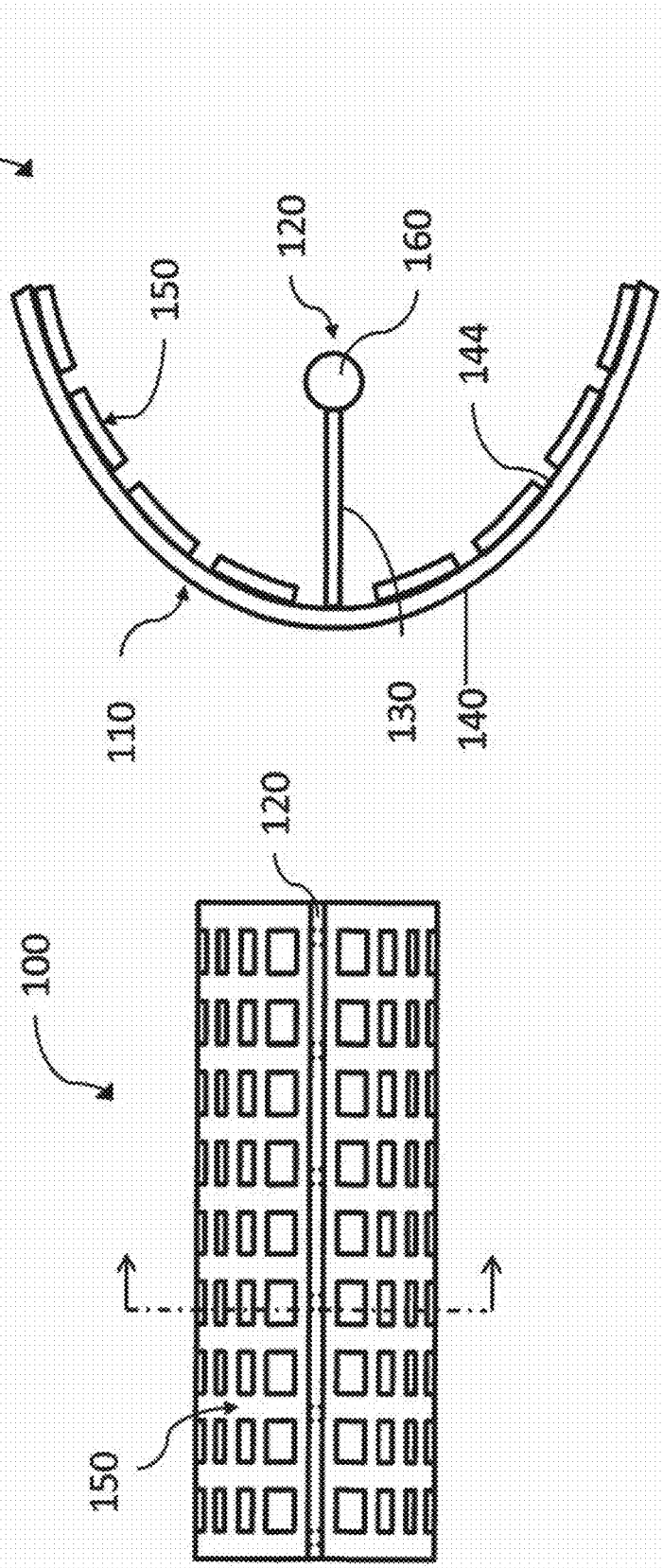

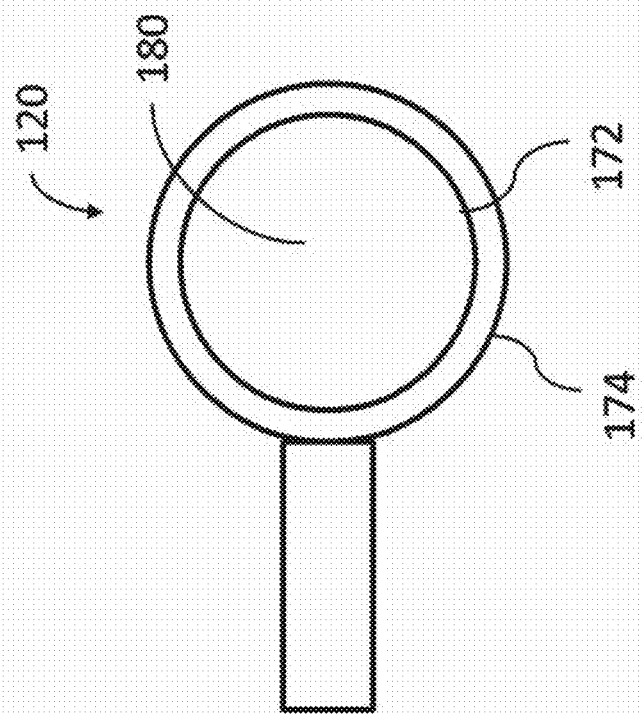
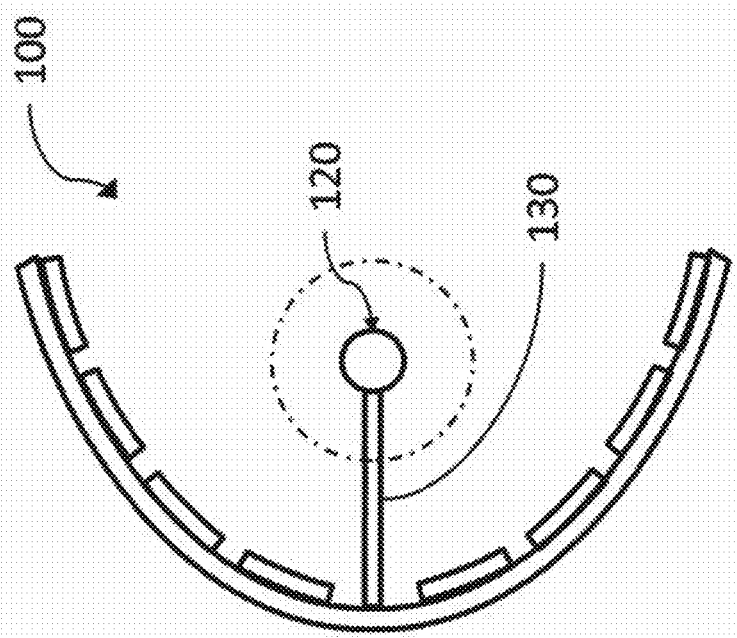

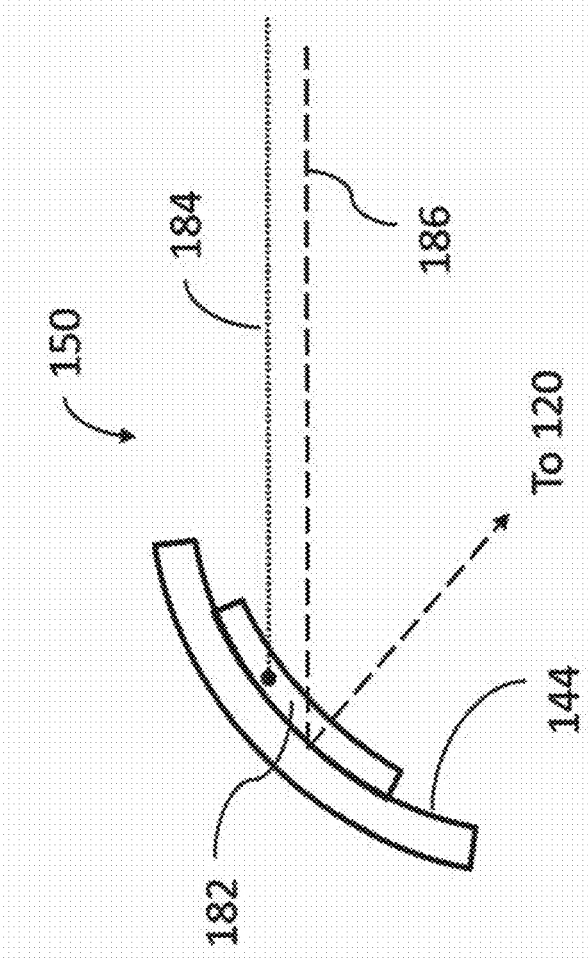
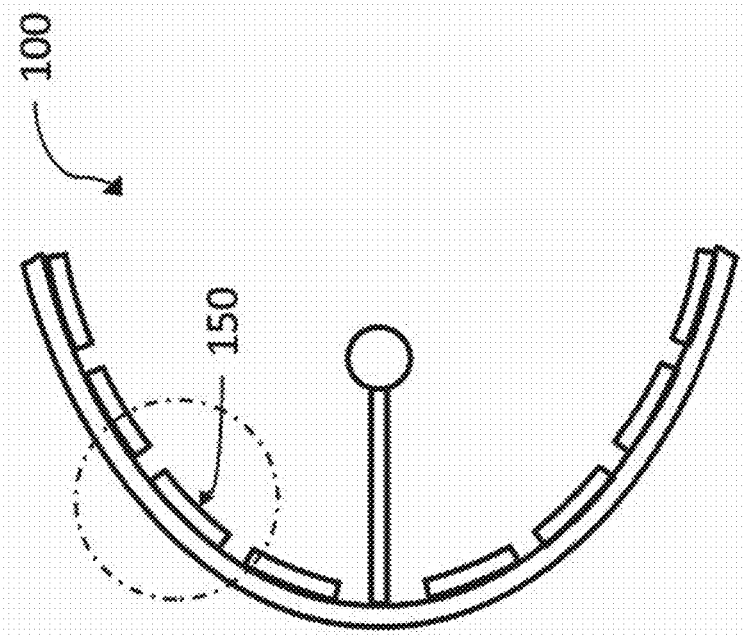

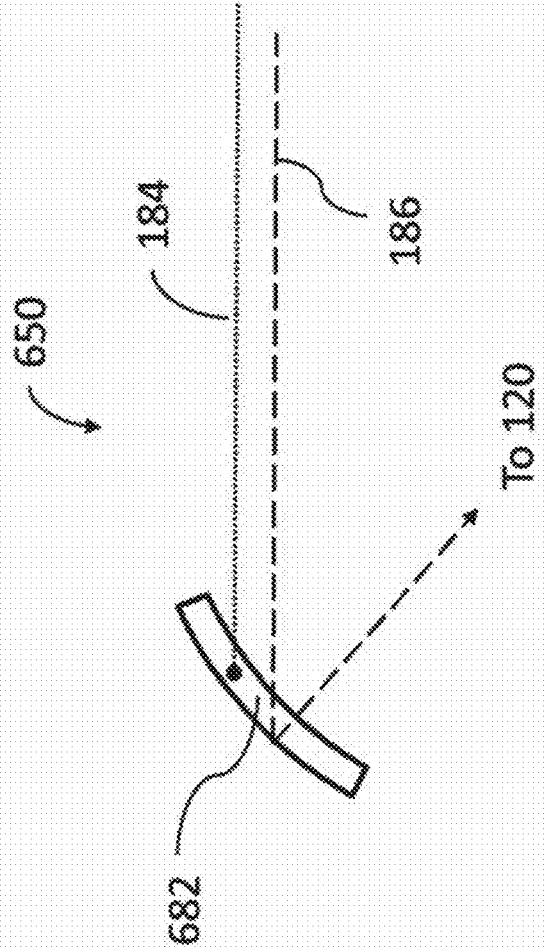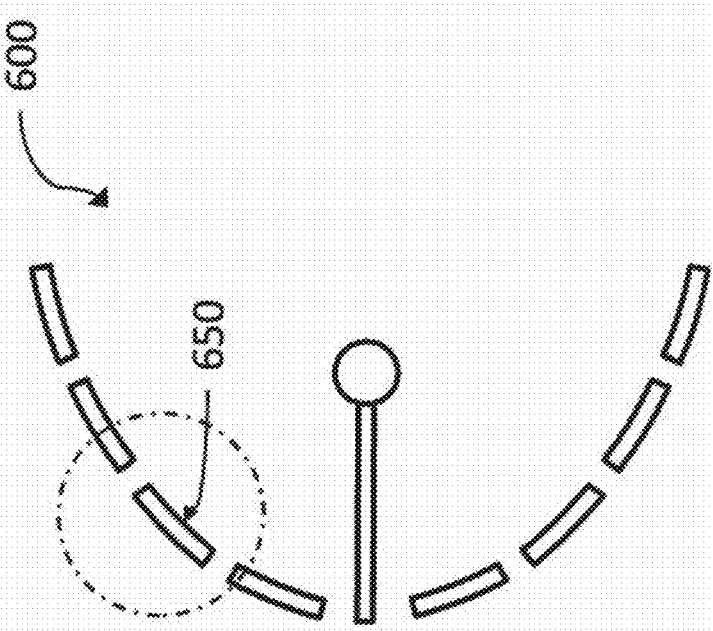

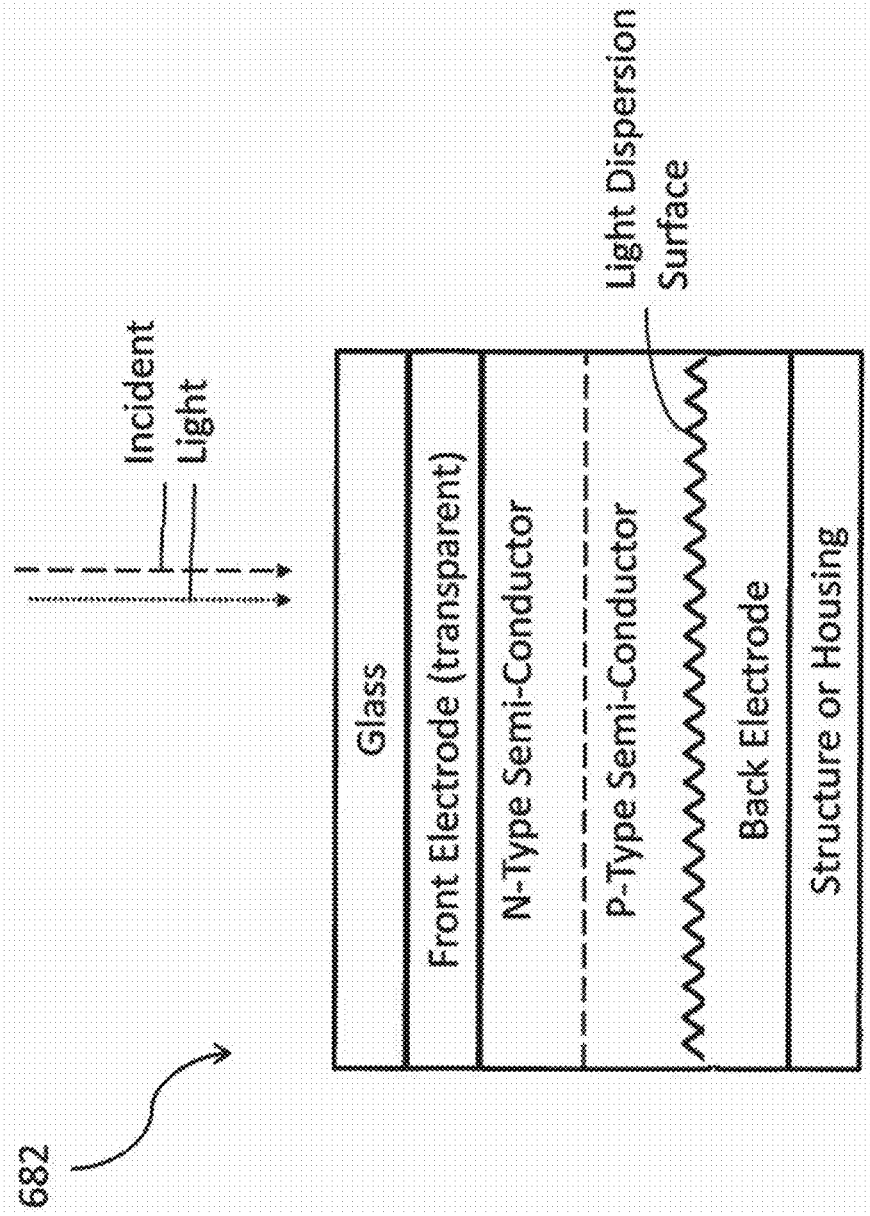

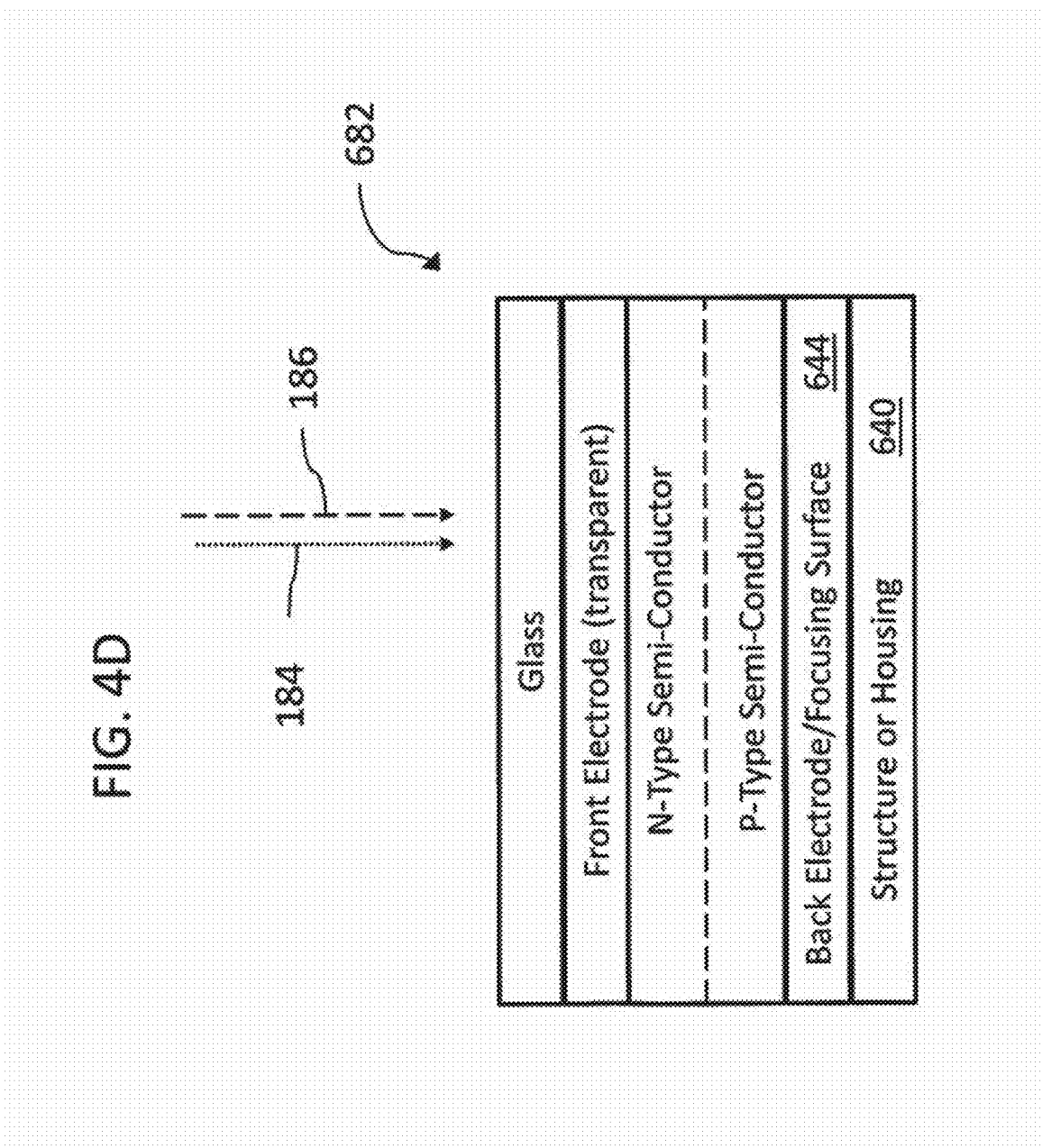

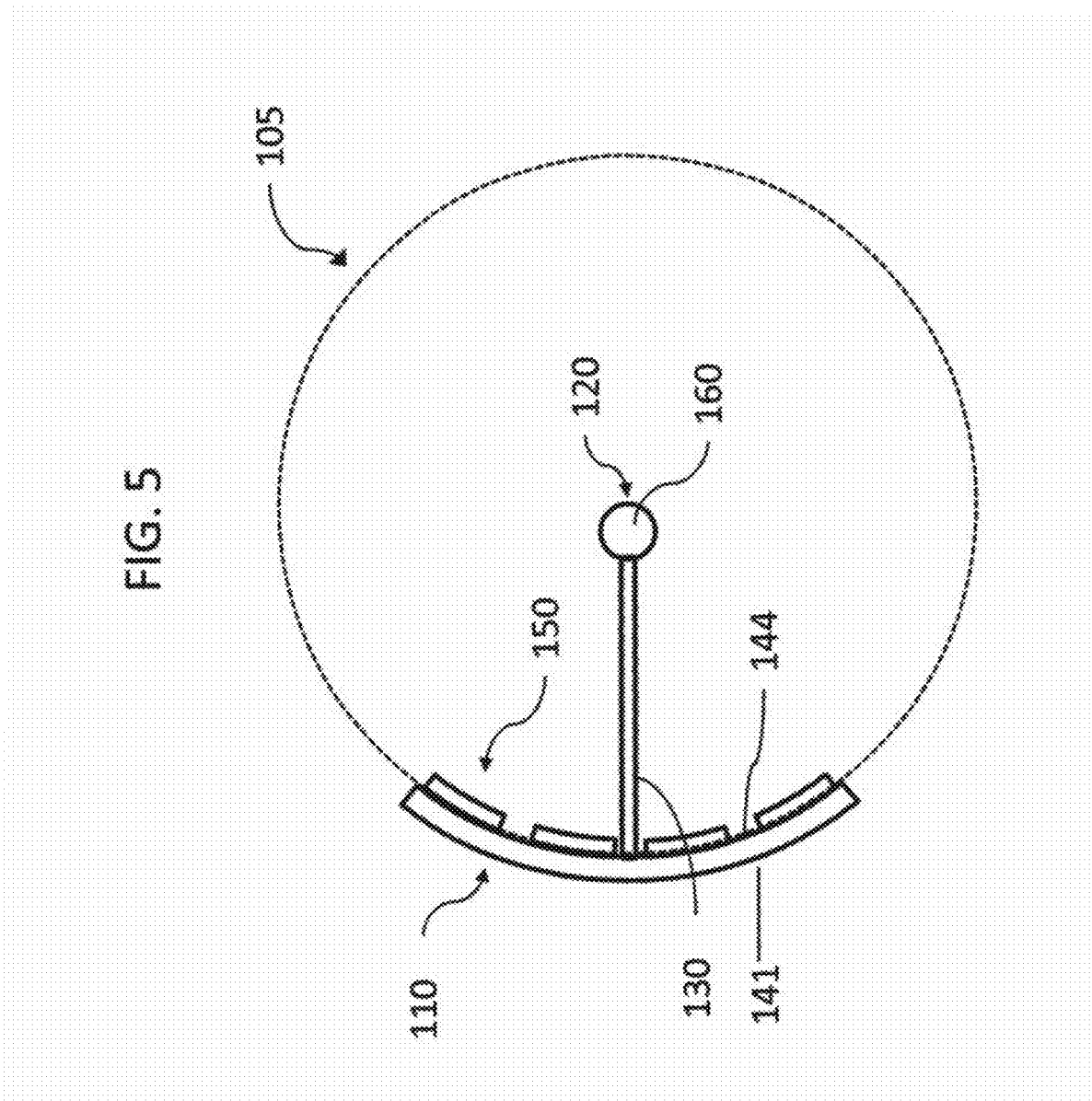

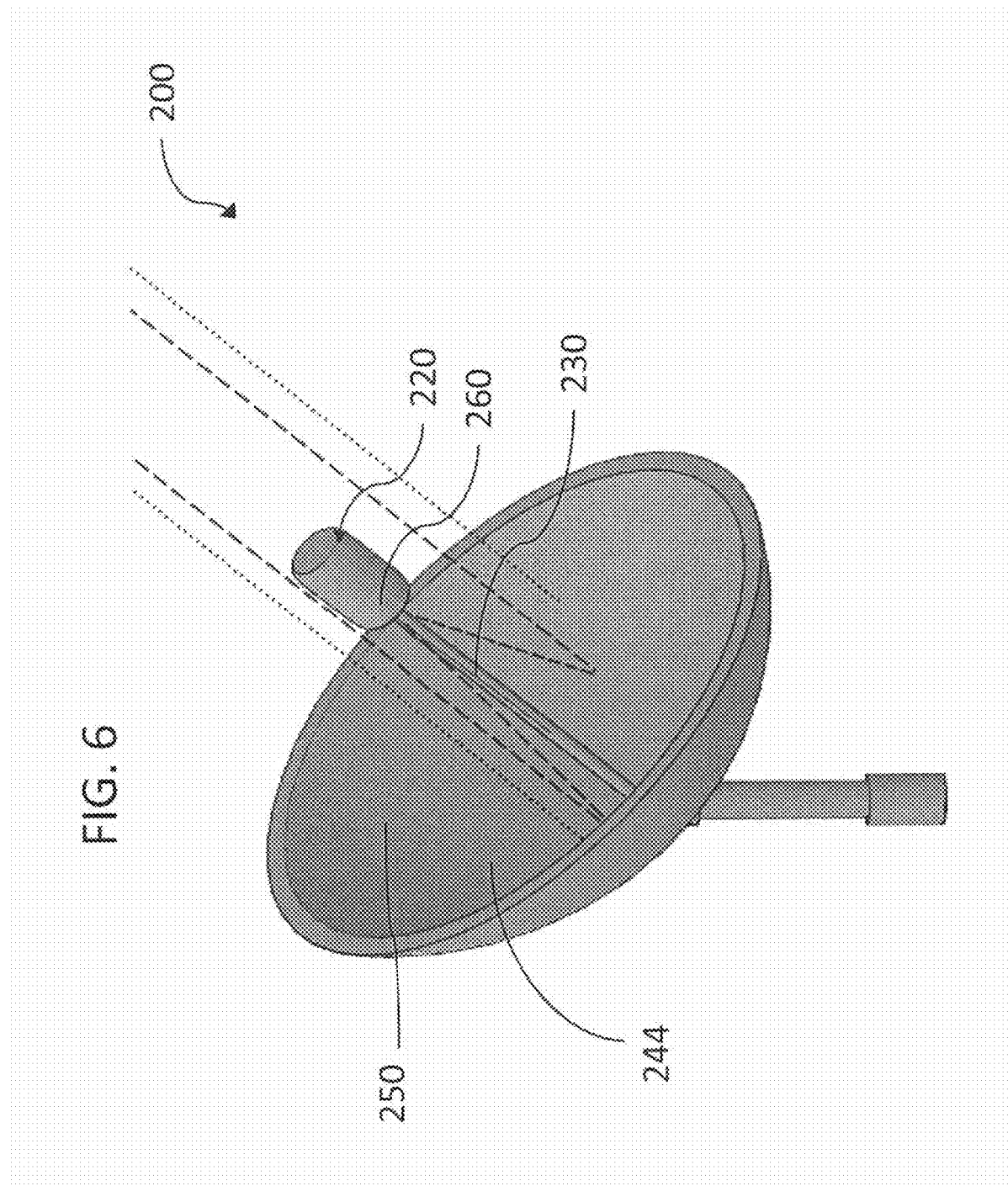

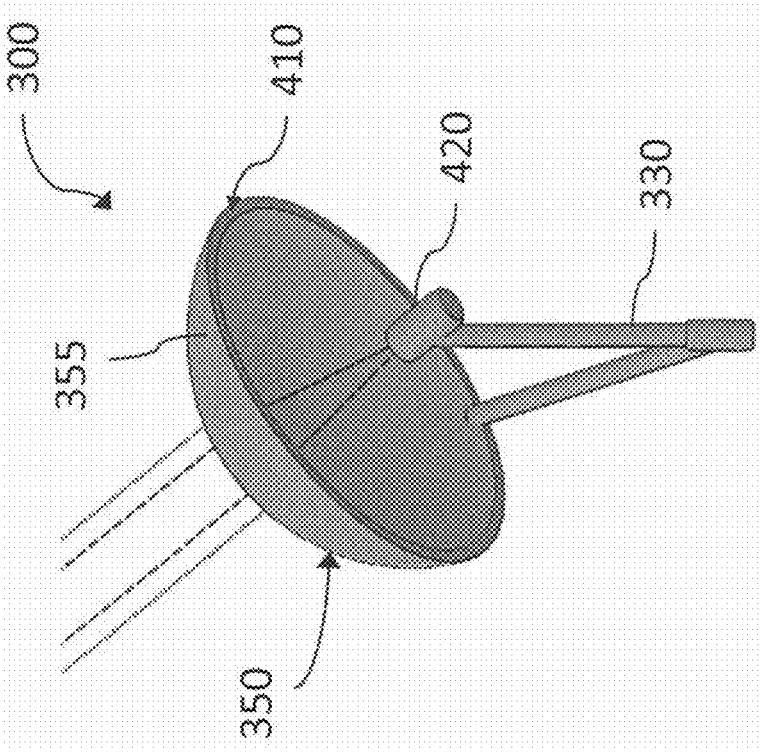
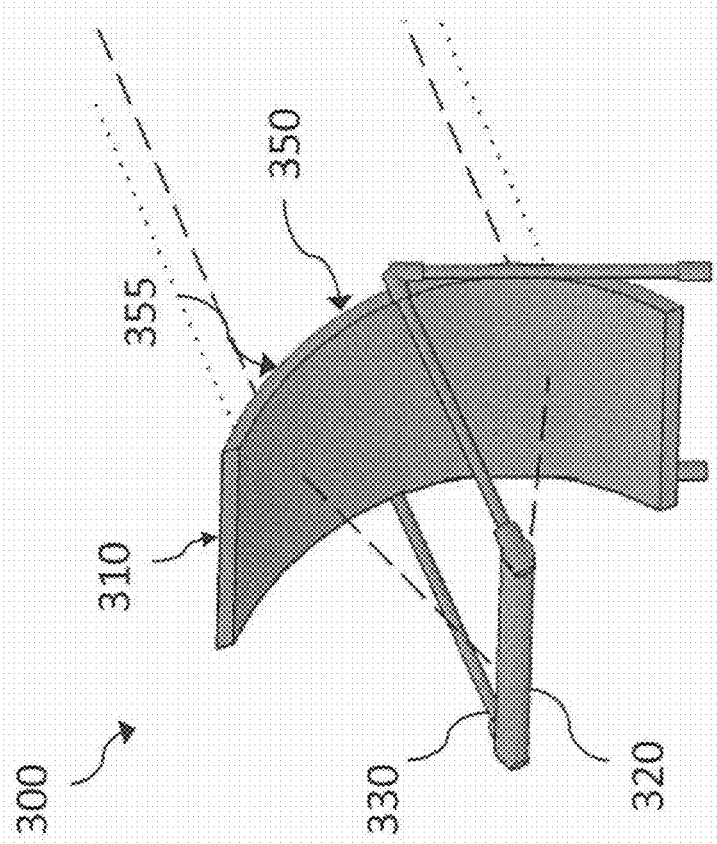

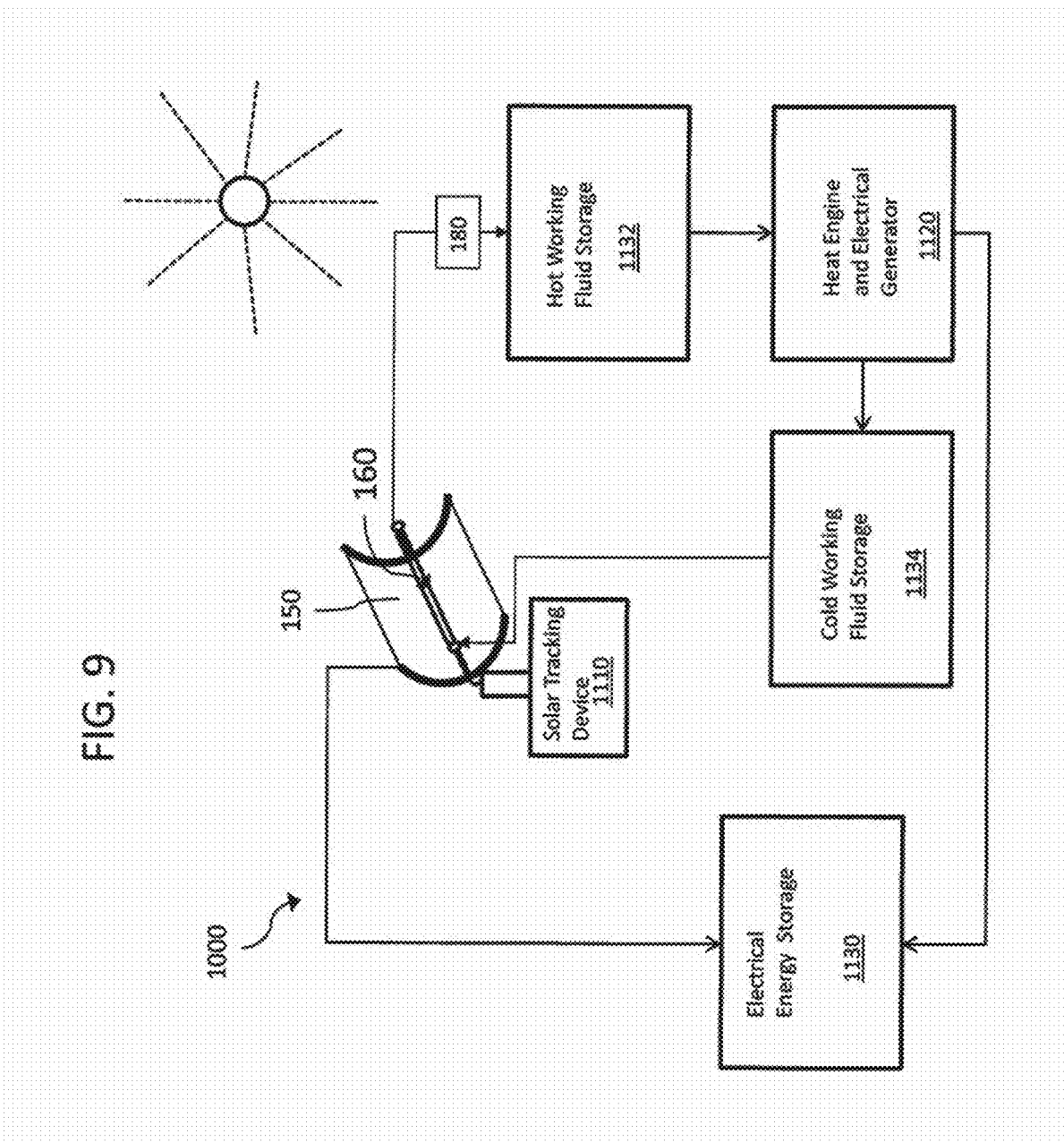

NON-CONCENTRATED PHOTOVOLTAIC AND CONCENTRATED SOLAR THERMAL HYBRID DEVICES AND METHODS FOR SOLAR ENERGY COLLECTION

TECHNICAL FIELD

Embodiments relate generally to generation of electric power by conversion of infra-red light, visible light or ultraviolet light, and more particularly to the combined use of non-concentrated photovoltaic devices and concentrated solar thermal devices.

BACKGROUND

Solar energy is a promising alternative to hydrocarbon based energy production. There are various types of solar energy collection systems that are known in the art, which generally fall exclusively into one of two categories: photovoltaic technology and solar thermal technology. Generally, photovoltaic technology utilizes photovoltaic cell array to convert solar energy into electricity. Alternatively, solar thermal technology utilizes a working fluid to absorb solar energy then transfer the absorbed energy to electrical energy using a heat engine.

Photovoltaic cells utilizes the photovoltaic effect in which incoming solar energy, in the form of photons, are absorbed by the electrons of a semiconducting crystalline structure. If the energy level of the incoming photon, which corresponds to the wavelength of the incoming photon, surpasses that of the excitation level of the electron (i.e., the bandgap potential) the electron will absorb the photon and excite to a higher level of energy. The excited electron is then a vehicle for electrical energy transfer. The output of photovoltaic cells is direct current electricity which can directly power electrical equipment or stored in a battery.

Solar thermal technology uses the solar energy to heat a working fluid (e.g., salt water or molten salt) which is then used for either heating purposes elsewhere, or if temperatures are high enough, in a heat engine and generator producing electricity. In order for temperatures to reach useful heat engine temperatures, such as that needed to power a steam turbine, a solar concentrating structure is typically needed to intensify the incoming solar energy. Commonly used solar concentrating structures are reflective troughs and dishes as well as various lenses.

A common issue in both types of solar power collection is efficiency. In photovoltaic technology, one of the greatest efficiency losses is due that inability to utilize all of the energy from photons having various wavelengths of the solar spectrum. As previously mentioned, a particular semiconducting crystalline structure of a photovoltaic cell absorbs some portion of photons incident thereon having a certain wavelength or shorter, yet the amount of energy absorbed from each photon-electron interaction is limited to the energy of the bandgap potential. Thus, the excess energy present in a photon having a wavelength that is shorter than that of the bandgap potential of the electron is lost. Further, all photons having wavelengths that are longer, i.e. lower energy, than that needed to excite the electron are lost in their entirety, and typically pass through the semiconductor. To combat this loss of efficiency, conventional improvements in the art have included stacking semiconducting crystalline structures having different bandgap potentials in attempt to better capture a greater spectrum of solar light. Cost and technical feasibility, however, limits the number of semiconducting crystalline layers still leaving a large portion of the solar spectrum unused.

Solar thermal, on the other hand utilizes the entire solar spectrum, at least to the extent that each photon can transfer energy in the form of heat to a working fluid. However, the efficiency of transferring short wavelength light into electricity is lower than the efficiency of a photovoltaic cell designed to absorb that particular wavelength of light. Thus, solar thermal falls short of the energy conversion efficiencies of photovoltaic cells with respect to certain wavelengths.

To remedy these inefficiencies, hybrid solar collection devices have been developed. For instance, U.S. Pat. No. 8,455,755 to Correia, which is incorporated herein by reference, utilizes a reflective trough that focuses sunlight to a common point where a photovoltaic strip absorbs a portion of the incident solar spectrum for electrical conversion and absorbs the rest as thermal energy which is conducted to a thermal energy collector. While Correia utilizes both photovoltaic and solar thermal technologies to capture a greater efficiency rate, the thermal energy captured by the device must be absorbed and transferred through the photovoltaic strip inferring that the photovoltaic strip must operate at fairly high temperatures which negatively affects their efficiencies.

Thus, there are inefficiencies present in both photovoltaic and solar thermal technologies and there is a need in the industry to improve these inefficiencies in order for solar energy to remain a viable alternative to hydrocarbon energy.

SUMMARY

According to embodiments, the efficiencies present in conventional solar technologies can be increased by utilizing a larger portion of the spectrum of solar light for use in power generation. Embodiments of the invention relate generally to a solar energy collection device having a focusing element with a shape configured to direct collimated incident light to a common focal region. A photovoltaic cell array is then arranged on the focusing element. The photovoltaic cell array comprises a plurality of individual photovoltaic cells, each having a bandgap potential. A focus tube is then arranged at the focal region. The focus tube is configured to have an internal bore containing a working fluid and also configured to absorb incident and focused light that is and transferred to the working fluid. The focus tube is mechanically coupled to the focusing element with a mounting structure serving to maintain focus tube's position at the focal region.

In use, incident collimated light having a high enough energy to exceed the bandgap potential of the individual photovoltaic cells is absorbed by the photovoltaic cells and converted into electricity. The remaining light is passed through the photovoltaic cells onto the focusing element where the light is then focused to a common focal region where the focus tube is located. The focused light is absorbed as radiant energy by the focus tube and transferred to the working fluid contained within. The heated working fluid is then routed through the focus tube to heated working fluid storage which can be used to power a heat engine and electrical generator where the radiant energy is converted into electricity.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures, in which:

FIGS. 1A and 1B are top and side views, respectively, of a parabolic trough power collector according to an embodiment;

FIGS. 2A and 2B are side and cutaway views depicting the focus tube of the embodiment previously depicted in FIGS. 1A and 1B;

FIGS. 3A and 3B are side and cutaway views of the reflective trough and photovoltaics of the embodiment previously depicted in FIGS. 1A and 1B;

FIGS. 4A and 4B are side and cutaway views of embodiment wherein the reflective surface is incorporated in photovoltaic cell;

FIG. 4C is a cross-sectional view of a prior art photovoltaic cell having a rough back electrode;

FIG. 4D is a cross-sectional view of a photovoltaic cell according to an embodiment having a specular reflector back electrode;

FIG. 5 is a side view of a circular reflector according to an embodiment;

FIG. 6 is a perspective view of a circular reflector according to an embodiment;

FIGS. 7A and 7B are perspective views of trough- and circular-style transparent, focusing solar collectors, according to two embodiments;

FIG. 9 is a flowchart of an embodiment for collecting energy from incident radiation using both photovoltaic and solar-thermal mechanisms in a common device.

Figure 8:
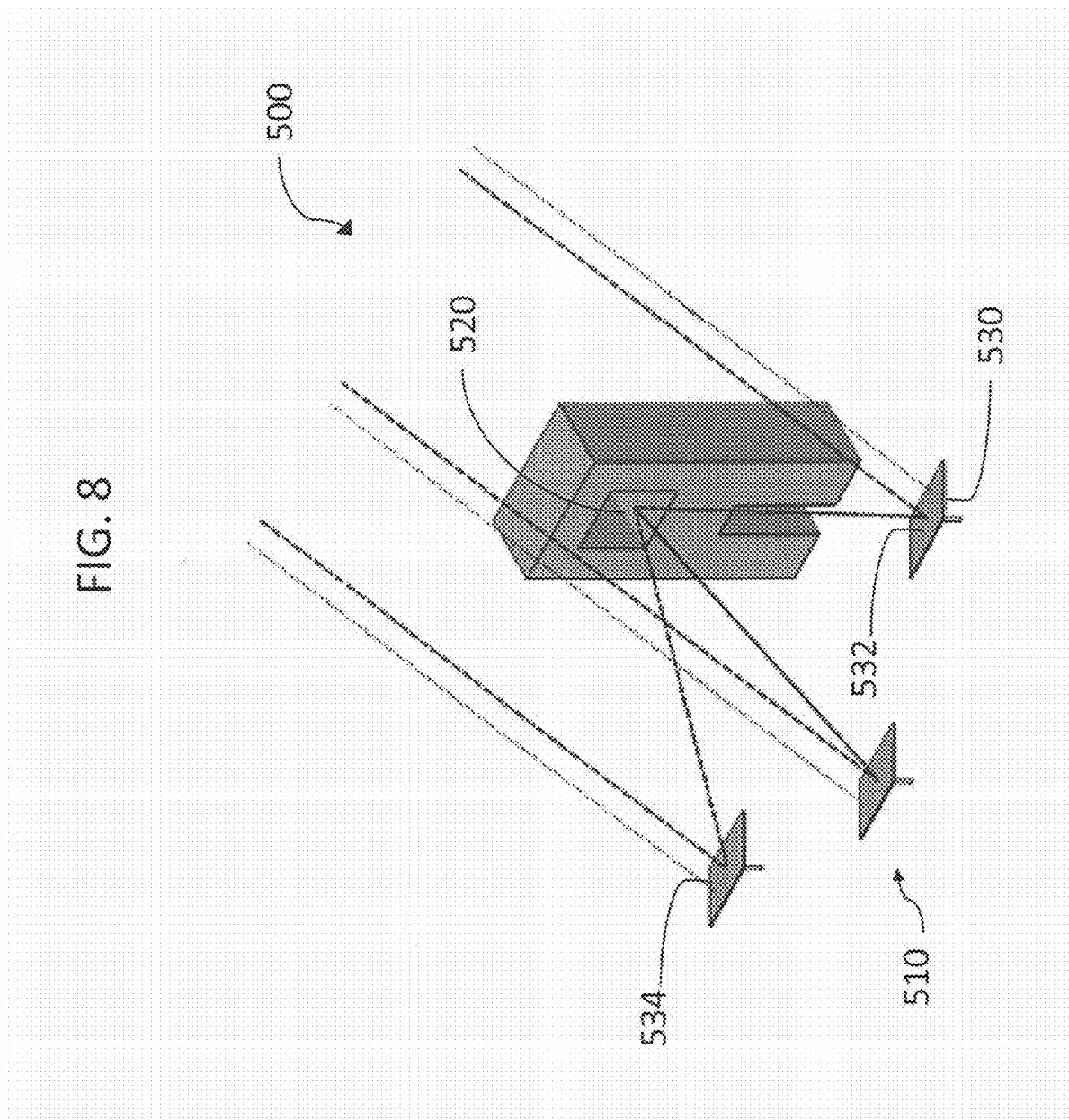
FIG. 8 is a perspective view of a concentrated solar power tower arrangement according to an embodiment.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Embodiments are directed to converting infra-red, ultraviolet and visible light into electricity using photovoltaic modules and solar heat collection technology in a single solar energy collection system. Embodiments utilize the focusing element, in which the focusing element functions to direct the incident collimated to focal region by virtue of its shape and optical properties.

One embodiment, shown in top view in FIG. 1A, is a parabolic trough collection device 100. As shown in more detail in the cross section view of the parabolic trough 100 in FIG. 1B, collection device 100 includes a focusing surface 110, a focus tube 120, and a mounting structure 130. Focusing surface 110 further includes a parabolic structure 140 with a photovoltaic array 150. Parabolic structure 140 includes a reflective surface 144 arranged on the inside portion of parabolic structure 140, i.e. the side facing focus tube 120. In other embodiments, such as embodiments in which parabolic structure 140 is at least partially translucent or transparent, reflective surface 144 could be arranged elsewhere in the body of parabolic structure 140. For example, reflective surface 144 could be arranged behind a sheet of low-iron glass, in embodiments, or could be housed in an encapsulant material (not shown) to prevent corrosion or other damage to reflective surface 144.

Reflective surface 144 is configured to reflect incident collimated light. Light from a very distant source can be considered nearly perfectly collimated, such as sunlight. Because of the parabolic shape of reflective surface 144 of parabolic structure 140, incident collimated light is reflected to a focal area 160.

Taking a closer look at focus tube 120 in FIGS. 2A and 2B, focus tube 120 includes an inner bore 172, and an absorbing surface 174. Absorbing surface 174 is configured to absorb the radiant heat from the focused light being reflected from reflective surface 144. Absorbing surface 174 could include a low-reflectance dark surface finish such as flat black paint, a material that approximates a physical blackbody, or other suitable surface finishes designed for absorbing radiant heat energy from light while emitting a relatively low amount of thermal radiation. Focus tube 120 is configured to conduct heat generated at the absorbing surface 174 to inner bore 172 and would accordingly be made of aluminum or other suitable thermally conductive material. In embodiments, inner bore 172 can have a textured outer portion, such as fins extending into inner bore 172 from absorbing surface 174.

Inner bore 172 serves as a routing structure for a working fluid 180 to absorb the radiant heat generated at absorbing surface 174 and conducted through tube structure 170. Focus tube 120 is mechanically coupled to parabolic structure 140 via mounting structure 130 such that focus tube 120 remains fixed at focal area 160. In embodiments, mounting structure 130 is a rigid post placed along the axis of collection device 100. In alternative embodiments, mounting structure 130 is an A-frame design or configured to suspend tube structure 170 with wires other suitable supporting structures.

Taking a closer look at a photovoltaic cell 182 of photovoltaic array 150 in FIGS. 3A and 3B, photovoltaic cell 182 is mechanically coupled to reflective surface 144. Photovoltaic cell 182 is configured to have a bandgap potential such that short wavelength light 184, which is light having an energy level above the bandgap potential, is absorbed by photovoltaic cell 182 and converted into electricity via photovoltaic effect. Long wavelength light 186 having an energy level that does not meet or exceed the bandgap potential of photovoltaic cell 182 passes through photovoltaic cell 182 and is reflected off of reflective surface 144 toward focus tube 120.

As an alternate to placing photovoltaic cells on the reflective surface, a reflective surface can be incorporated in the photovoltaic cell. Side view 600 and cutaway view 650 of such embodiment is shown in FIGS. 4A and 4B. To further explain this embodiment we compare the conventional photovoltaic cell as shown FIG. 4C to photovoltaic cell having specular back electrode as shown in FIG. 4D. In conventional photovoltaic cells as shown in FIG. 4C, incident light passes through protective glass, or other transparent medium, and through the front electrode into the p-type and n-type semi-conductive layers where the above-bandgap photons are converted into high energy level electrons. The front electrode generally comprises a transparent, conductive thin film, typically indium tin oxide, allowing incident light to pass, yet still has the ability to conduct electricity. The back electrode is configured to conduct electricity and also has a light dispersing surface such that incident light is reflected at an angle and takes a longer path of travel through the p-type and n-type semi-conductive layers. Dispersing incident light in this manner increases the likely hood that the reflected photons will be absorbed.

By contrast, FIG. 4D shows reflective surface 644 of photovoltaic cell 682 as the back electrode. Using reflective surface 644 as the back electrode removes the light dispersion characteristic of conventional photovoltaic cells in order to controllably reflect light that passes through the semi-conductive layers. Back electrode/focusing surface 644 shown in FIG. 4D is a specular reflector, in embodiments. Furthermore, back electrode/focusing surface 644 can be configured to reflect a high portion of the light not absorbed by photovoltaic cell 682. For example, back electrode/focusing surface 644 can be aluminum, silver, or copper, or some combination thereof.

Materials used to form back electrode/focusing surface 644, and have the benefits of reflecting a high percentage of light that has a wavelength too high to be captured by the pn junction of photovoltaic cell 682. Therefore high wavelength irradiance that is not captured by the pn junction of photovoltaic cell 682 will be reflected back specularly through the pn junction a second time for potential conversion to electricity, and if it passes by the pn junction a second time for conversion to thermal energy.

In embodiments, a multilayer film of aluminum, silver, and/or copper can be arranged as the back electrode/focusing surface 644 to increase the level of solar irradiance that is captured either as electrical energy, or thermal energy.

Photovoltaic cell 682 is configured to have a bandgap potential such that short wavelength light 184, which is light having an energy level above the bandgap potential, is absorbed by photovoltaic cell 682 and converted into electricity via photovoltaic effect. Long wavelength light 186 having an energy level that does not meet or exceed the bandgap potential of photovoltaic cell 682 is reflected off of reflective surface 644 toward focus tube 120.

In other embodiments, there may be multiple layers of photovoltaic cells 682 each layer having a different bandgap potential. In this embodiment, the top photovoltaic cell layer absorbs the highest energy light, the second layer absorbs the light having the second highest bandgap potential and so on until the lights having energy lower than the lowest bandgap potential layer is reflected off of reflective surface 644 towards focus tube 120. Each photovoltaic cell 682 is electrically coupled to a main power transmission system. In embodiments, some light having high enough wavelength to be absorbed by photovoltaic cell 682 is not absorbed, and also reflects towards focus tube 120.

As an alternative to parabolic trough collection device 100, circular trough collection device 105, as shown in FIG. 5 can be configured to have a circular structure 141 having a circular cross section as opposed to a parabolic shape. Because a small enough section of a circular reflection device can approximate the focal effects of a parabolic shape, circular trough collection device 105 may provide a more cost effective alternative to parabolic trough collection device 100 to direct reflected light to focal area 160, because of manufacturing advantages present in working with circular-shaped materials, rather than parabolic-shaped materials.

Both parabolic trough collection device 100 and circular trough collection device 105 could be configured as a collection dish 200 as shown in the perspective view of FIG. 6. Collection dish 200 utilizes a focusing dish 210, focus reservoir 220, mounting structure 230, reflective surface 244, and a photovoltaic array 250 to accomplish the same full spectrum conversion of incident collimated light as parabolic trough collection device 100 and circular trough collection device 105 but utilizes a dish arrangement instead of a trough.

Further, instead of using focus tube 120 to rout working fluid 180 through a linear focal area 160, collection dish 200 utilizes focus reservoir 220 to rout working fluid 180 to and from a point focal area 260. Photovoltaic array 250 is similarly arranged on reflective surface 244 to absorb incident collimated light having an energy level above the photovoltaic array 250's bandgap potential. The remaining light passes through photovoltaic array 250 and is reflected off of reflective surface 244 to focus reservoir 220 being mechanically coupled to focusing dish 210 by mounting structure 230. In embodiments, the working fluid can be routed through mounting structure to and from focal point 260. An advantage to using collection dish 200 would be a smaller form factor as well as a higher concentration of incident collimated light that is available to focus reservoir 220 because reflected light converges at a point instead of a line.

In an embodiment shown in FIG. 7A, a parabolic refractor 300 focuses light through a linear refracting surface 310 onto a focus tube 320 arranged behind refracting surface 310. Focus tube 320 is mechanically coupled to linear refracting surface 310 via mounting structure 330. In this embodiment, a photovoltaic array 350 is arranged on incident surface 355, to accomplish the same full spectrum conversion of incident collimated light as described above. In this embodiment, photovoltaic array 350 would comprise photovoltaic cells having a transparent, thin-film electrode acting both the front electrode and the back electrode ensuring full photovoltaic cell transparency. Instead of reflecting below-bandgap-potential light to a focal area 160, light that is below the bandgap potential of photovoltaic array 350 is refracted to focus tube 320 in order to heat working fluid 180. In a similar dish-type embodiment shown in FIG. 7B, a point refracting surface 410 and focus reservoir 420 replace linear refracting surface 310 and focus tube 320 in parabolic refractor 300 in order to produce a higher intensity focal area for the low energy light. In a further embodiment of both linear and point versions of parabolic refractor 300, a Fresnel type refractor, instead of conventional continuous curve type refractors such as embodied in linear refracting surface 310 and point refracting surface 410, can be used to save space, weight and possibly cost in constructing the refracting surfaces.

The refractive properties of the trough of FIG. 7A or the dish of FIG. 7B can be modified as desired to provide incident light at the focal region 320 or 420, respectively. Following Snell's Law, an ideal index of refraction can be determined. In embodiments, the index of refraction appropriate for each embodiment can vary based on the photovoltaics used. For example, in embodiments where the photovoltaics have a bandgap causing selective absorption of light having a wavelength below 1 eV, it may be beneficial to set the refractive index of parabolic refractor 300 to focus light having a lower energy than 1 eV towards focal region 320 or 420. In other embodiments, where the bandgap of the photovoltaic is higher or lower, the appropriate index of refraction may vary.

In embodiments with a stack of photovoltaics having different bandgaps, it may be beneficial to set the index of refraction so that light having an energy lower than that corresponding to the lowest bandgap will be focused towards focal region 320 or 420, following Snell's law. One of skill in the art will recognize that other factors, such as the efficiency of each solar cell within its operating range of wavelengths, as well as the overall solar irradiance spectrum, could be factored in to determine the proper index of refraction that will focus the majority of the energy from the incident collimated light that is not absorbed by the photovoltaics towards the focal region.

In an alternative embodiment, a heliostat collector 500 shown in FIG. 8 comprises a photovoltaic reflector array 510 being selectively arranged around a central collector 520. Each photovoltaic reflector unit 530 comprises a photovoltaic array 532 arranged on a flat reflector 534. Similar to previously discussed embodiments, incident collimated light having an energy level above that of the bandgap potential of the photovoltaic array 532 is absorbed by photovoltaic array 532 and the remaining light is passed through to the reflector 534 and reflected to central collector 520. Central collector 520 transfers the radiant heat to working fluid 180. In heliostat collector 500 embodiment, an advantage may be gained by having a plurality of flat, relatively cheaper photovoltaic reflector units that focus incident collimated light to central collector 520 instead of expensive curved surfaces and individual light collection devices as described by other embodiments.

In order to effectively utilize collimated light coming from the sun, the embodiments herein could comprise a component of a solar energy collection system 1000 as shown in FIG. 9. Solar energy collection system 1000 could comprise a solar tracking device 1110, an electro-thermal converter 1120, an electrical energy storage component 1130, and an embodiment of a solar collection device described herein. Solar tracking device 1110 is configured to sense the direction in which the solar collection device should be facing in order to achieve maximum intensity and to ensure that focal area 160 is accurately oriented. Once the proper direction is identified, the solar collection device is adjusted, via computer controlled motor or other suitable motion control devices. Solar tracking device 1110 is configured to continually assess the position of the light source and adjust the solar collection device accordingly. Solar energy collection system 1000 also utilizes electro-thermal converter 1120 to take heated working fluid 180, stored in hot working fluid storage 1132, and use it to power a heat engine, such as a steam engine, which powers an electrical generator. The electricity created by photovoltaic array 150, as well as the electricity created from electro-thermal converter 1120, is stored in electrical energy storage component 1130. Once the thermal energy is drawn from heated working fluid 180, the working fluid is returned to cold working fluid storage 1134. Electrical energy storage component 1130 could comprise an electrical battery system or other suitable electrical energy storage technology. In an alternative embodiment, electricity created by photovoltaic array 150, as well as the electricity created from electro-thermal converter 1120, could also be directly connected to an electrical grid after it is suitably transformed.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A solar energy collection device comprising:
a focusing element having a light-incident focusing surface and a curved shape configured to direct collimated incident light having an energy to a focal region;
a focus tube arranged at the focal region, the focus tube having an internal bore containing a working fluid and configured to absorb at least a portion of the energy and convert the portion of the energy into thermal energy, the focus tube further configured to transfer the thermal energy to the working fluid;
a mounting structure, wherein the structure mechanically couples the focus tube to the focusing surface and further aligns to maintain the focus tube location at the focal region; and
a photovoltaic cell array arranged at and directly contacting the focusing surface, the photovoltaic cell array comprising a plurality of individual photovoltaic cells, each having a bandgap potential, and receiving non-concentrated light.

2. The device of claim 1, wherein the focusing element is reflective and the photovoltaic cell array is arranged between the focusing element and the focal region.

3. A device in claim 1 wherein the each of the plurality of individual photovoltaic cells includes a back electrode, and wherein the back electrode comprises the reflective focusing element.

4. The device of claim 1, wherein: the plurality of individual photovoltaic cells define at least one bandgap energy corresponding to a predetermined wavelength; and the focusing element is transparent and comprises an index of refraction configured to refract collimated incident light having a higher wavelength than the predetermined wavelength to the focal region.

5. The device of claim 1 wherein the photovoltaic cell array comprises a plurality of layers of individual photovoltaic cells, each of the plurality of layers having a unique bandgap potential.

6. The device of claim 4, wherein the photovoltaic cell array comprises a plurality of layers of photovoltaic cells, each layer of photovoltaic cells having a different bandgap potential corresponding to a corresponding predetermined wavelength, and wherein the index of refraction is configured to refract collimated incident light having a higher wavelength than the highest of the predetermined wavelengths.

7. The device of claim 1, further comprising a second photovoltaic cell array arranged on a surface of the focus tube, wherein the second photovoltaic cell array is transparent.

8. The device of claim 1, further comprising an electrical storage system configured to store electrical energy produced by the photovoltaic cell array and the electrical energy produced from converting the thermal energy in the working fluid to electrical energy.

9. A method for collecting solar energy using the solar energy collection device of claim 1 comprising:
   focusing collimated incident light with the focusing element having the curved shape configured to direct collimated incident light to the focal region;
   arranging the focus tube at the focal region;
   routing the working fluid through the internal bore of the focus tube allowing energy from the incident and focused sunlight to pass to the working fluid to heat the working fluid;
   routing the heated working fluid through a heat engine to extract the thermal energy to be converted into electrical energy;
   arranging the focus tube at the focal region by mechanically coupling the focus tube to the focusing element with the mounting structure;
   arranging the photovoltaic cell array comprising a plurality of individual photovoltaic cells on the focusing element, each individual photovoltaic cell having a bandgap potential; and
   tracking the collimated incident light such that the focusing element is moveably arranged to continuously face the direction of the collimated incident light.

10. The method of claim 9, each of the plurality of individual photovoltaic cells having a reflective surface configured to reflect a portion of collimated incident light to the focus tube.

11. The method of claim 9, wherein each of the plurality of individual photovoltaic cells having cross-sectional transparency arranged on and incorporated with an incident side of a transparent converging arrangement of the focusing element transmitting a portion of the collimated incident light to the focus tube.

12. The method of claim 10, wherein each of the plurality of individual photovoltaic cells convert collimated incident light of different wavelengths by having individual photovoltaic layers with different bandgap potentials.

13. The method of claim 11, wherein each of the plurality of individual photovoltaic cells convert collimated incident light of different wavelengths by having individual photovoltaic layers with different bandgap potentials.

14. The method of claim 9, wherein a second transparent photovoltaic cell array, arranged on the focus tube, absorbs a portion of focused collimated incident light and transmits the remaining portion of focused collimated incident light to the focus tube.

15. The method of claim 9, wherein an electrical storage system stores electrical energy produced by the photovoltaic cell array and the electrical energy produced from converting the thermal energy in the working fluid to electrical energy.

16. The method of claim 9, wherein the focusing element directs the collimated incident light using a parabolic focusing arrangement.

* * * * *